US011289563B2

(12) United States Patent
Kanzaki et al.

(10) Patent No.: US 11,289,563 B2
(45) Date of Patent: Mar. 29, 2022

(54) ELECTRODE CONTACT STRUCTURE, DISPLAY CONTROL DRIVER, AND DISPLAY DEVICE

(71) Applicant: SHARP KABUSHIKI KAISHA, Sakai (JP)

(72) Inventors: Yohsuke Kanzaki, Sakai (JP); Takao Saitoh, Sakai (JP); Masahiko Miwa, Sakai (JP); Masaki Yamanaka, Sakai (JP); Yi Sun, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 14 days.

(21) Appl. No.: 16/651,290

(22) PCT Filed: Sep. 28, 2017

(86) PCT No.: PCT/JP2017/035170
§ 371 (c)(1),
(2) Date: Mar. 26, 2020

(87) PCT Pub. No.: WO2019/064411
PCT Pub. Date: Apr. 4, 2019

(65) Prior Publication Data
US 2020/0273931 A1    Aug. 27, 2020

(51) Int. Cl.
H01L 29/08    (2006.01)
H01L 27/32    (2006.01)

(52) U.S. Cl.
CPC ...... H01L 27/3265 (2013.01); H01L 27/3262 (2013.01)

(58) Field of Classification Search
CPC .................... H01L 27/3265; H01L 27/3262
See application file for complete search history.

(56) References Cited

U.S. PATENT DOCUMENTS

| 9,660,010 B2* | 5/2017 | Park ................ H01L 27/326 |
| 2002/0055206 A1 | 5/2002 | Zhang |
| 2010/0078700 A1 | 4/2010 | Saito |
| 2011/0273397 A1* | 11/2011 | Hanari ............ G09G 3/3233 |
| | | 345/174 |

(Continued)

FOREIGN PATENT DOCUMENTS

| JP | H08-255875 A | 10/1996 |
| JP | 2000-091423 A | 3/2000 |

(Continued)

Primary Examiner — Phuc T Dang
(74) Attorney, Agent, or Firm — ScienBiziP, P.C.

(57) ABSTRACT

An electrode contact structure includes a first inorganic insulating film, a first electrode formed on the first inorganic insulating film, a second inorganic insulating film formed on the first inorganic insulating film and the first electrode to cover the first electrode, a second electrode formed on the second inorganic insulating film, a third inorganic insulating film formed on the second inorganic insulating film and the second electrode to cover the second electrode, and a third electrode configured to cover a contact hole formed in the third inorganic insulating film and the second inorganic insulating film, and electrically connect to each of the first electrode and the second electrode exposed in the contact hole.

7 Claims, 8 Drawing Sheets

(56) References Cited

U.S. PATENT DOCUMENTS

| | | | |
|---|---|---|---|
| 2012/0068185 A1* | 3/2012 | Kim | H01L 28/60 257/72 |
| 2012/0299189 A1 | 11/2012 | Nakajima | |
| 2013/0119388 A1* | 5/2013 | Lee | H01L 27/3265 257/59 |
| 2015/0108467 A1* | 4/2015 | Moriguchi | H01L 27/1248 257/43 |
| 2015/0243231 A1 | 8/2015 | Yokozeki | |

FOREIGN PATENT DOCUMENTS

| JP | 2002-176179 A | 6/2002 |
|---|---|---|
| JP | 2010-109338 A | 5/2010 |
| JP | 2012-231148 A | 11/2012 |
| JP | 2012-248678 A | 12/2012 |
| JP | 2015-158572 A | 9/2015 |

\* cited by examiner

ELECTRODE CONTACT STRUCTURE, DISPLAY CONTROL DRIVER, AND DISPLAY DEVICE

TECHNICAL FIELD

The present disclosure relates to electrode contact structures, display control drivers, and display devices.

BACKGROUND ART

PTL1 discloses a display apparatus having a configuration in which a capacitance electrode 311, a wiring line 312, and a gate electrode 301 are integrated with a transparent material.

CITATION LIST

Patent Literature

PTL1: JP 2015-158572 A

SUMMARY OF INVENTION

Technical Problem

In the configuration of it is difficult to miniaturize an electrode contact structure in which three different electrodes are connected.

The present disclosure has been conceived to solve the above problem, and an object thereof is to achieve a further miniaturized electrode contact structure.

Solution to Problem

In order to solve the above problem, an electrode contact structure according to an aspect of the present disclosure includes a first inorganic insulating film; a first electrode formed on the first inorganic insulating film; a second inorganic insulating film formed on the first inorganic insulating film and the first electrode to cover the first electrode; a second electrode formed on the second inorganic insulating film; a third inorganic insulating film formed on the second inorganic insulating film and the second electrode to cover the second electrode; and a third electrode configured to cover a contact hole formed in the third inorganic insulating film and the second inorganic insulating film, and electrically connect to each of the first electrode and the second electrode exposed in the contact hole.

In order to solve the above problem, an electrode contact structure according to an aspect of the present disclosure includes a first inorganic insulating film; a first electrode formed under the first inorganic insulating film; a second inorganic insulating film formed on the first inorganic insulating film; a second electrode formed on the second inorganic insulating film; a third inorganic insulating film formed on the second inorganic insulating film and the second electrode to cover the second electrode; and a third electrode configured to cover a contact hole formed in the first inorganic insulating film, the second inorganic insulating film and the third inorganic insulating film, and electrically connect to each of the first electrode and the second electrode exposed in the contact hole.

Advantageous Effects of Invention

According to an aspect of the present disclosure, such an effect is exhibited that a further miniaturized electrode contact structure can be achieved.

DESCRIPTION OF EMBODIMENTS

Configuration of Display Apparatus 1

Figure 1:
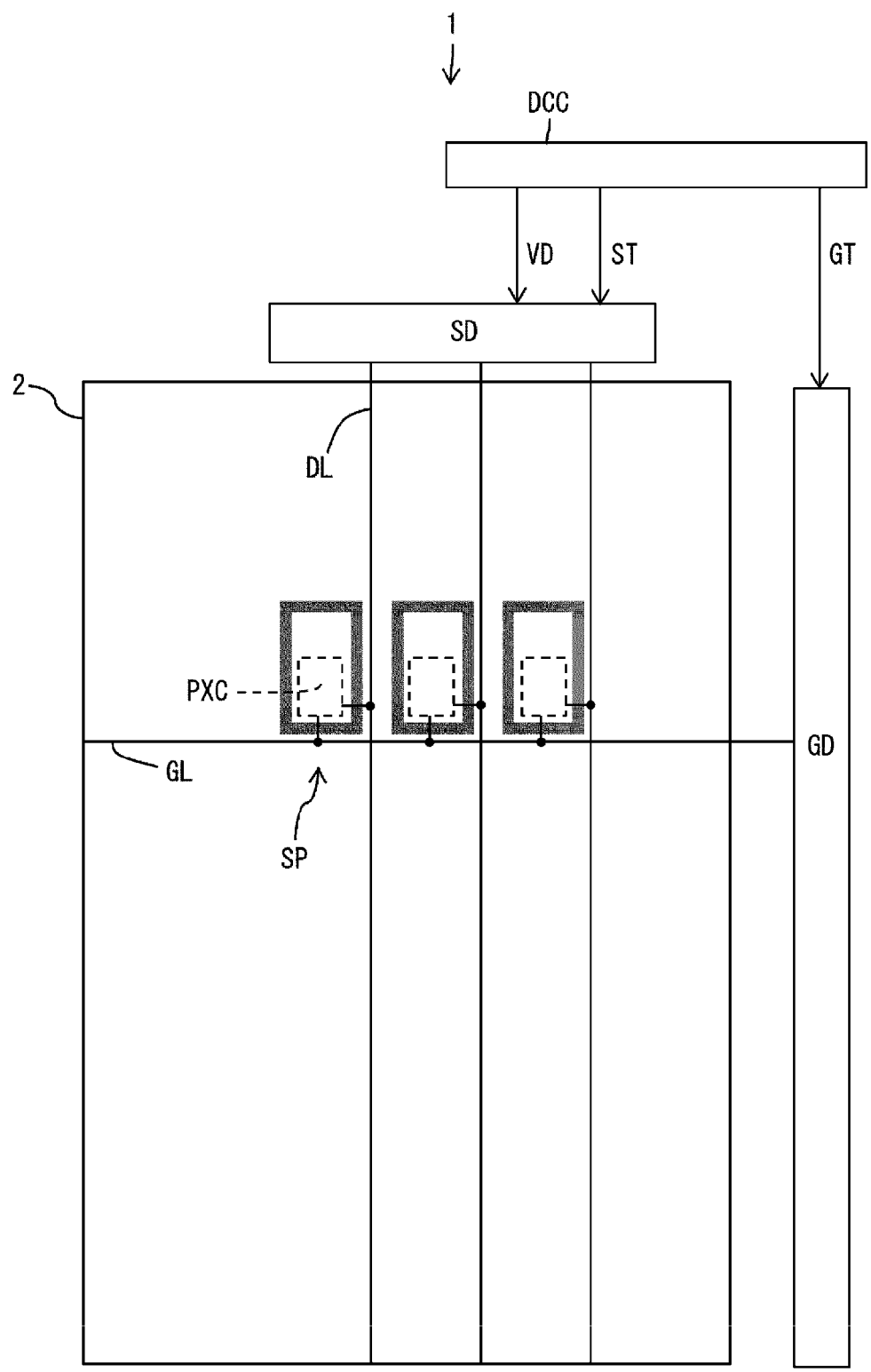
FIG. 1 is a schematic plan view illustrating a configuration of a display apparatus including a display device.

FIG. 1 is a schematic plan view illustrating a configuration of a display apparatus 1 including a display device. As illustrated in FIG. 1, the display apparatus 1 includes a display device 2, a source driver SD, a gate driver GD, and a display control circuit DCC. The display device 2 is implemented as various types of display devices, such as an organic EL display device. The display device 2 includes a plurality of light-emitting elements formed in a light-emitting element layer 5, and a subpixel circuit PXC, a data line DL, a scanning signal line GL and a (low potential side) light-emitting power supply electrode LPL formed in a TFT layer 4, where a subpixel SP is constituted by, for example, the light-emitting element and the subpixel circuit PXC corresponding thereto.

In the display device 2, the light-emitting element and the subpixel circuit PXC connected thereto are provided for each subpixel, and the subpixel circuit PXC is connected to the data line DL, the scanning signal line GL, and the light-emitting power supply electrode LPL. The data line DI, is connected to the source driver SD, and the scanning signal line GL is connected to the gate driver GD. The display control circuit DCC outputs a source timing signal ST and an image data VD to the source driver SD, and outputs a gate timing signal GT to the gate driver GD.

Configuration of Display Device 2

Figure 2:
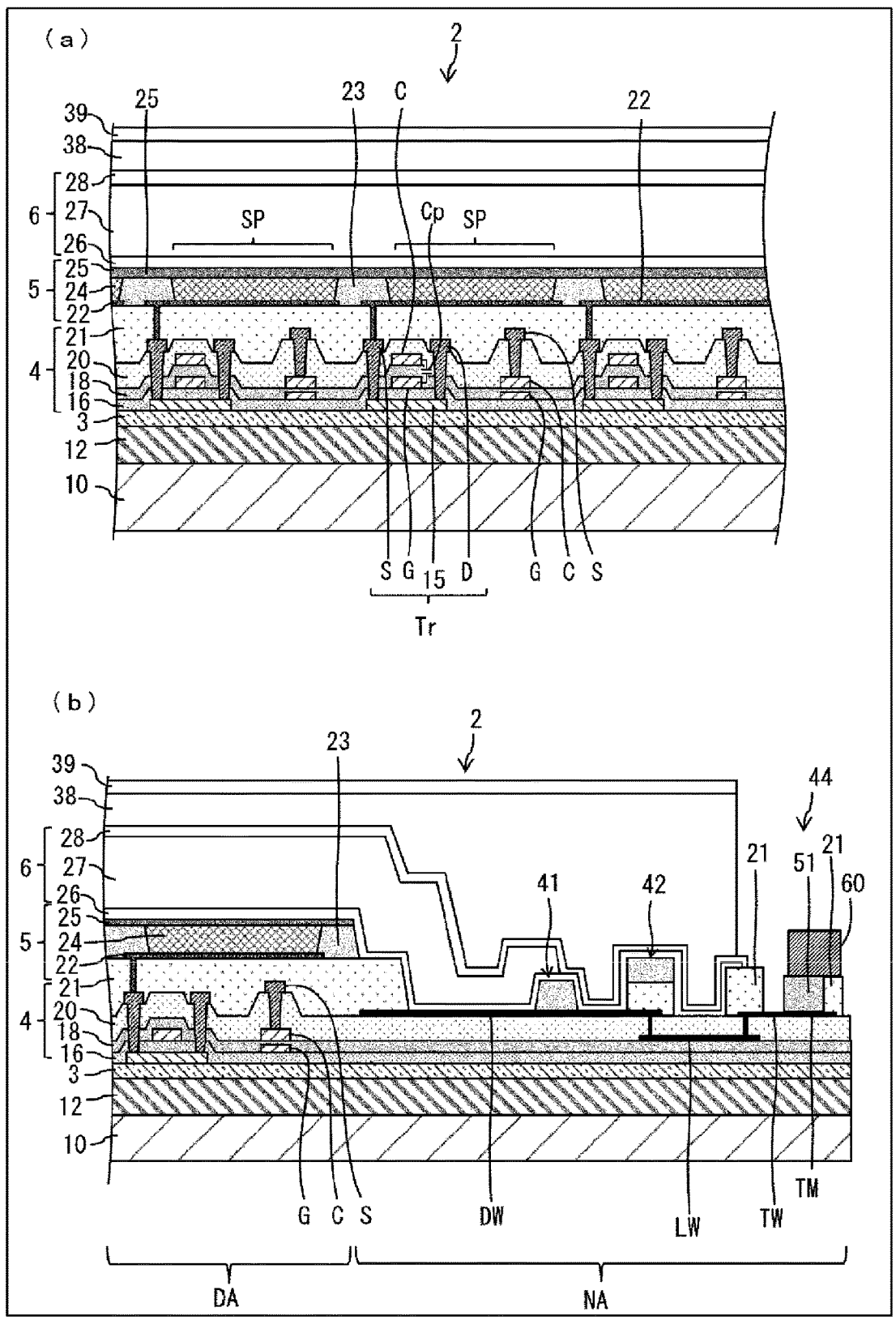
FIG. 2 is a cross-sectional view illustrating a configuration example of the display device.

FIG. 2 is a cross-sectional view illustrating a configuration example of the display device 2. The display device 2 illustrated in FIG. 2 is a top-emitting device that emits light upward, and includes, in sequence from the bottom side, a base material 10, a resin layer 12, a barrier layer 3 (base coat layer), the TFT layer 4, the light-emitting element layer 5, a sealing layer 6, an adhesive layer 38, and a function film 39.

Examples of the material of the resin layer 12 include a polyimide, an epoxy, and a polyamide, or the like. Examples of the material of the base material 10 include polyethylene terephthalate (PET).

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, for example, formed using chemical vapor deposition (CVD).

The TFT layer 4 includes a semiconductor film 15, an inorganic insulating film 16 formed in a layer above the semiconductor film 15, a gate electrode G formed in a layer above the inorganic insulating film 16, an inorganic insulating film 18 formed in a layer above the gate electrode G, a capacitance electrode C formed in a layer above the inorganic insulating film 18, an inorganic insulating film 20 formed in a layer above the capacitance electrode C, a source electrode S and a drain electrode D both formed in a layer above the inorganic insulating film 20, and a flattening film 21 formed in a layer above the source electrode S and the drain electrode D. Electrostatic capacitance Cp is formed by the gate electrode G and the capacitance electrode C formed above the gate electrode G.

A thin film transistor Tr (light emission control transistor) is configured to include the semiconductor film 15, the inorganic insulating film 16 (gate insulating film), and the gate electrode G. The source electrode S is connected to a source region of the semiconductor film 15, and the drain electrode D is connected to a drain region of the semiconductor film 15.

The semiconductor film 15 is formed of low-temperature polysilicon (JPS) or an oxide semiconductor, for example. Note that, although the TFT provided with the semiconductor film 15 as the channel is illustrated as having a top gate structure in FIG. 2, the TFT may have a bottom gate structure (when the TFT channel is an oxide semiconductor, for example).

The inorganic insulating films 16, 18, and 20 can be constituted, for example, by a silicon oxide (SiOx) film or a silicon nitride (SiNx) film, or a layered film of these, formed using CVD. The flattening film (interlayer insulating film) 21 can be constituted, for example, by a coatable photosensitive organic material, such as a polyimide, an acrylic, or the like.

The gate electrode G, the source electrode 5, the drain electrode D, and the terminal are formed of a metal single layer film or a layered film including, for example, at least one of aluminum (Al), tungsten (W), molybdenum (Mo), tantalum (Ta), chromium (Cr), titanium (Ti), and copper (Cu).

A terminal portion 44 is provided on an end portion (a non-active area NA that does not overlap with the light-emitting element layer 5) of the TFT layer 4. The terminal portion 44 includes a terminal TM used for connection with an electronic circuit board 60 such as an IC chip or a flexible printed circuit board (FPC), and a terminal electrode TW connected to the terminal TM. The terminal electrode TW is electrically connected to various electrodes in the TFT layer 4 via a relay electrode LW and an extended electrode DW.

The terminal TM, the terminal electrode TW, and the extended electrode DW are formed in the same process as that of the source electrode S, for example, and thus, are formed in the same layer (on the inorganic insulating film 20) and of the same material (two layers of titanium film and an aluminum film sandwiched between the two layers of titanium film, for example) as those of the source electrode S. The relay electrode LW is formed in the same process as that of the capacitance electrode C, for example. End faces (edges) of the terminal TM, the terminal electrode TW, and the extended electrode DW are covered by the flattening film 21.

The light-emitting element layer 5 (an organic light-emitting diode layer, for example) includes an anode electrode 22 formed in a layer above the flattening film 21, a bank 23 that defines a subpixel of an active area DA (a region that overlaps with the light-emitting element layer 5), a light-emitting layer 24 formed in a layer above the anode electrode 22, and a cathode electrode 25 formed in a layer above the light-emitting layer 24, where a light-emitting element (an organic light-emitting diode (OLED), for example) is configured to include the anode electrode 22, the light-emitting layer 24, and the cathode electrode 25.

The bank 23 covers an edge of the anode electrode 22, and the light-emitting layer 24 is formed in a region (a light-emitting region) surrounded by the bank 23, using vapor deposition or an ink-jet method. In a case where the light-emitting element layer 5 is an organic light-emitting diode (OLED) layer, for example, a hole injection layer, a hole transport layer, the light-emitting layer 24, an electron transport layer, and an electron injection layer are layered above a bottom surface of the bank (a part where the anode electrode 22 is exposed). Here, the layers aside from the light-emitting layer 24 can be common layers.

The anode electrode 22 is constituted by layering Indium Tin Oxide (ITO) and an alloy containing Ag, for example, and has light reflectivity (to be described below in more detail). The cathode electrode 25 can be constituted by a light-transmitting conductive material such as Indium Tin Oxide (ITO) and Indium Zinc Oxide (IZO).

If the light-emitting element layer 5 is an OLED layer, positive holes and electrons recombine inside the light-emitting layer 24 in response to a drive current between the anode electrode 22 and the cathode electrode 25, and light is emitted as a result of excitons, which are generated by the recombination, falling into a ground state. Since the cathode electrode 25 is transparent and the anode electrode 22 is light-reflective, the light emitted from the light-emitting layer 24 travels upwards and results in top emission.

The light-emitting element layer 5 may be used not only in a case of constituting the OLED element, but also in a case of constituting an inorganic light-emitting diode or a quantum dot light-emitting diode.

A bulging body 41 and a bulging body 42, which define edges of an organic sealing film 27, are formed in the non-active area NA. The bulging body 41 functions as a liquid stopper when the organic sealing film 27 is applied using an ink-jet method, and the bulging body 42 functions as a backup liquid stopper. Note that a lower portion of the bulging body 42 is configured by the flattening film 21, and functions as a protection film for an end face of the extended electrode DW. An upper portion of the bank 23, the bulging body 41, and the bulging body 42 can be formed in the same process, for example, by using a coatable photosensitive organic material such as a polyimide, an epoxy, or an acrylic.

The sealing layer 6 is transparent, and includes an inorganic sealing film 26, which covers the cathode electrode 25, the organic sealing film 27 formed in a layer above the inorganic sealing film 26, and an inorganic sealing film 28, which covers the organic sealing film 27. The inorganic sealing films 26, 28 may be made of a silicon oxide film, a silicon nitride film, a silicon oxynitride film, or a layered film of these, formed by CVD using a mask, for example.

The organic sealing film 27 is thicker than the inorganic sealing films 26 and 28, is a transparent organic film, and can be constituted with a coatable photosensitive organic material such as a polyimide or an acrylic. For example, after coating the inorganic sealing film 26 with an ink containing such an organic material using an ink-jet method, the ink is cured by UV irradiation. The sealing layer 6 covers the light-emitting element layer 5 and inhibits foreign matters, such as water and oxygen, from infiltrating to the light-emitting element layer 5.

The function film 39 has an optical compensation function, a touch sensor function, a protection function, or the like, for example. The electronic circuit board 60 is an IC chip or an FPC that is mounted on the terminal TM with an anisotropic conductive material 51 interposed therebetween, for example.

Subpixel Configuration

Figure 3:
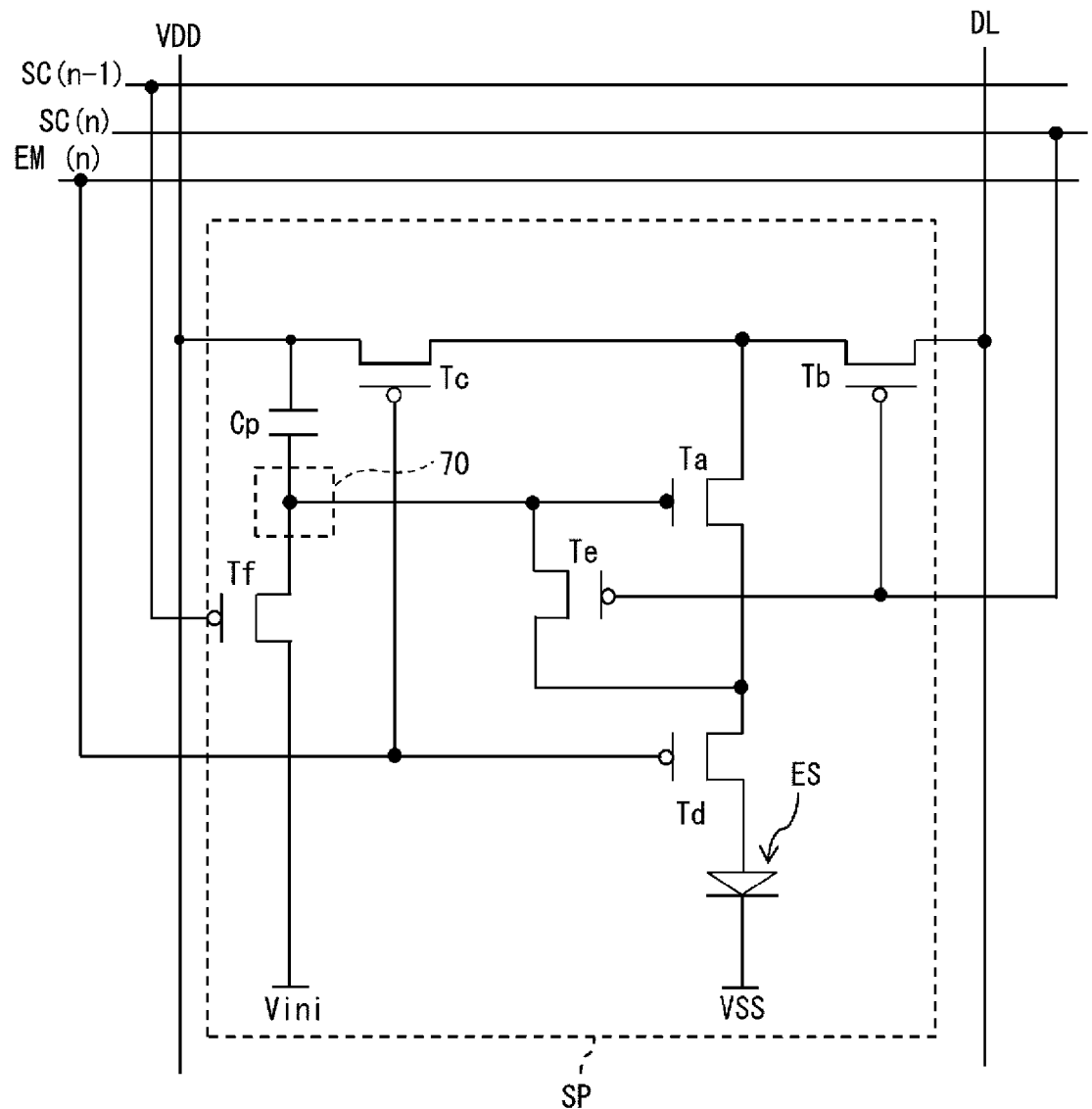
FIG. 3 is a circuit diagram illustrating a configuration example of a subpixel.

FIG. 3 is a circuit diagram illustrating a configuration example of a subpixel. The TFT layer 4 is provided with a plurality of data lines DL extending in the column direction, and a plurality of scanning lines SC(n) and a plurality of light emission control lines EM(n) extending in the row direction. A subpixel SP is connected to the data line DL and the scanning line SC(n). Note that a high-level power source VDD and a low-level power source VSS for driving the organic EL element, and an initialization voltage Vini are supplied to each of the subpixels SP. During the period in which the scanning line SC(n) is active, a potential signal corresponding to gray scale display data is supplied to each of the subpixels connected thereto from the data line DL.

The subpixel SP includes a drive transistor Ta, a switch transistor Tb, a power supply control transistor Tc, a light emission control transistor Td, a threshold voltage compensation transistor Te, an initialization transistor Tf, and electrostatic capacitance Cp, which are formed in the TFT layer 4 illustrated in FIG. 2, and a light-emitting element ES (an organic light-emitting diode, for example) including the light-emitting layer 24, which is formed in the light-emitting element layer 5 illustrated in FIG. 2. Each of the transistors Ta to Tf are all examples of the thin film transistor Tr.

In the drive transistor Ta, the gate electrode is connected to the source electrode of the threshold voltage compensation transistor Te, the drain electrode of the initialization transistor Tf, and one capacitance electrode forming the electrostatic capacitance Cp; the drain electrode is connected to the source electrode of the switch transistor Tb and the source electrode of the power supply control transistor Tc; and the source electrode is connected to the drain electrode of the light emission control transistor Td and the drain electrode of the threshold voltage compensation transistor Te.

The switch transistor Tb includes a gate electrode connected to the scanning line SC(n) of the n-th row, a drain electrode connected to the data line DL, and the source electrode which is connected to the drain electrode of the drive transistor Ta and the source electrode of the power supply control transistor Tc. In the power supply control transistor Tc, the gate electrode is connected to the light emission control line EM(n) in the nth row; the drain electrode is connected to a supply line for the high-level power source VDD and the other of the capacitance electrodes forming the electrostatic capacitance Cp; and the source electrode is connected to the drain electrode of the drive transistor Ta and the source electrode of the switch transistor Tb.

The anode electrode 22 of the light-emitting element ES is connected to the drain electrode of the light emission control transistor Td, and the cathode electrode 25 of the light-emitting element ES is connected to the supply line of the low-level power source VSS.

Configuration Example of Shift Register SRk

Figure 4:
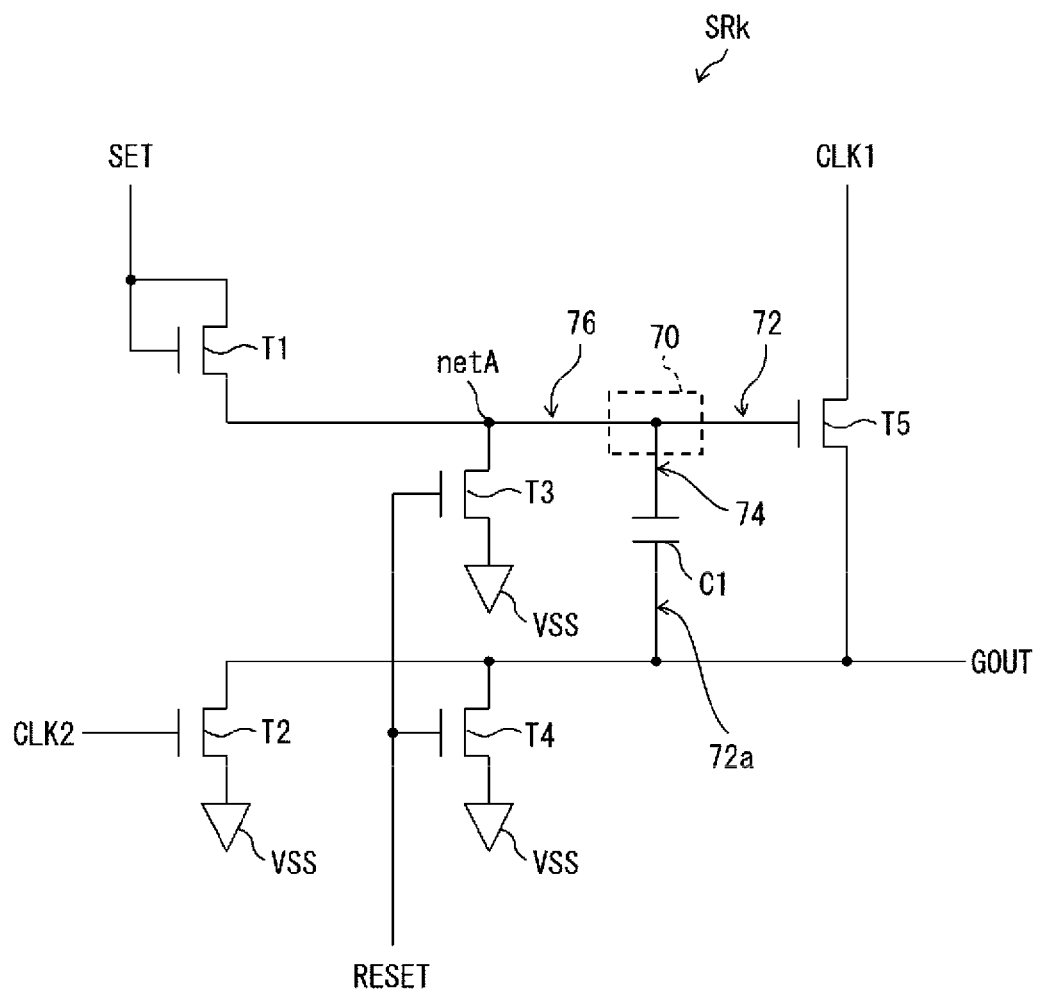
FIG. 4 illustrates a configuration example of a shift register SRk in each stage constituting a shift register circuit included in a gate driver.

FIG. 4 illustrates a configuration example of a shift register SRk in each stage constituting a shift register circuit included in the gate driver GD. The SRk in each stage includes five transistors T1, T2, T3, T4, and T5, and electrostatic capacitance C All these transistors are n-channel TFTs.

A gate and a drain of the transistor T1 are connected to a set terminal SET, and a source thereof is connected to a gate of the transistor T5. A drain of the transistor T5, which is the output transistor of each shift register SRk, is connected to a clock input terminal CLK1, and a source thereof is connected to an output terminal GOUT, respectively. Namely, the transistor T5 serves as a transmission gate to pass therethrough or block a clock signal inputted to the clock input terminal CLK1. The electrostatic capacitance C1 is connected between the gate and the source of the transistor T5. A node connected to the gate of the transistor T5 is referred to as "netA".

A gate of the transistor T3 is connected to a reset terminal RESET, and a drain thereof is connected to the node netA, and a source thereof is connected to a input terminal of the low-level power source VSS, respectively. A gate of the transistor T4 is connected to the reset terminal RESET, a drain thereof is connected to the output terminal GOUT, and a source thereof is connected to the input terminal of the low-level power source VSS, respectively.

A gate of the transistor T2 is connected to a clock terminal CLK2, a drain thereof is connected to the output terminal GOUT, and a source thereof is connected to the input terminal of the low-level power source VSS, respectively.

Figure 5:
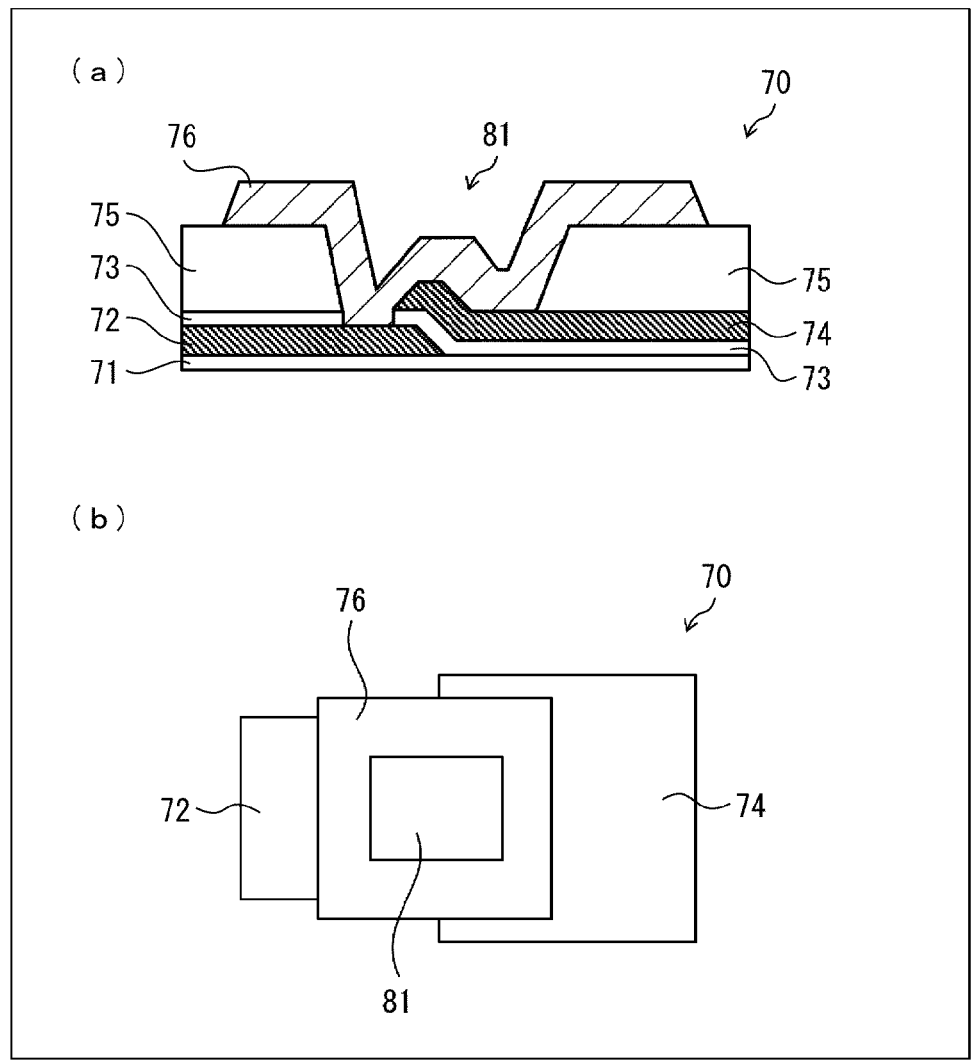
FIG. 5($a$) is a cross-sectional view illustrating a configuration example of an electrode contact structure formed near electrostatic capacitance in a shift register, and FIG. 5($b$) is a plan view illustrating the configuration example of the electrode contact structure.

(a) of FIG. 5 is a cross-sectional view illustrating a configuration example of an electrode contact structure 70 formed near the electrostatic capacitance C1 in the shift register SRk, and (b) of FIG. 5 is a plan view illustrating the configuration example of the electrode contact structure 70.

As illustrated in FIG. 4 and FIG. 5, the electrode contact structure 70 is formed near the electrostatic capacitance C1 in the shift register SRk constituting the gate driver GD (display control driver). The electrode contact structure 70 includes, in sequence from the bottom side, a gate insulating film 71 (first inorganic insulating film), a gate electrode 72 (first electrode), an inorganic insulating film 73 (second inorganic insulating film), a capacitance electrode 74 (second electrode), an inorganic insulating film 75 (third inorganic insulating film), and a source electrode 76 (third electrode). The gate electrode 72 is the gate electrode of the transistor T5 (first transistor), the capacitance electrode 74 is one of a pair of capacitance electrodes forming the electrostatic capacitance C1, and the source electrode 76 is the source electrode of the transistor T1 (second transistor). Another capacitance electrode that forms the electrostatic capacitance C1 is a conductive layer 72a formed in the same layer as the gate electrode 72. The gate electrode 72, the conductive layer 72a, the capacitance electrode 74, and the source electrode 76 are each a type of metal wiring line formed in the shift register SRk.

In the electrode contact structure 70, the gate electrode 72 is formed on the gate insulating film 71. The inorganic insulating film 73 is formed on the gate insulating film 71 and the gate electrode 72. An opening is formed in part of the inorganic insulating film 73, and in this opening, the gate electrode 72 and the source electrode 76 are connected. The capacitance electrode 74 is formed on the inorganic insulating film 73.

The inorganic insulating film 75 is formed on the inorganic insulating film 73 or on the capacitance electrode 74. A contact hole 81 passing through part of the inorganic insulating film 75 and part of the inorganic insulating film 73 is formed in the electrode contact structure 70. Part of the capacitance electrode 74 overlaps part of the gate electrode 72 with the inorganic insulating film 73 interposed therebetween in the contact hole 81. Part of the capacitance electrode 74 serves as an etching stopper when the opening is formed in the inorganic insulating film 73. The source electrode 76 covers the contact hole 81, and electrically connects to the gate electrode 72 and the capacitance electrode 74 exposed in the contact hole 81. In this manner, the gate electrode 72 and the capacitance electrode 74 are physically separated and electrically connected to each other via the source electrode 76.

In the electrode contact structure 70, the connection between the gate electrode 72 and the source electrode 76 and the connection between the capacitance electrode 74 and the source electrode 76 are carried out in the common contact hole 81. Accordingly, the distance between the gate electrode 72 and the capacitance electrode 74 can be shortened compared to a configuration in which each connection is carried out in a different contact hole. With this, the shift register SRk having the electrode contact structure 70 can be made smaller, and as a result, the gate driver GD including the shift register SRk can also be made smaller.

In addition, when the display apparatus 1 includes the miniaturized gate driver GD as part of the electronic circuit board 60 in the non-active area NA of the display device 2, the non-active area NA can be made narrower. This makes it possible to achieve the display device 2 and the display apparatus 1 with a narrower frame.

Other Configuration Examples of Electrode Contact Structure 70

Figure 6:
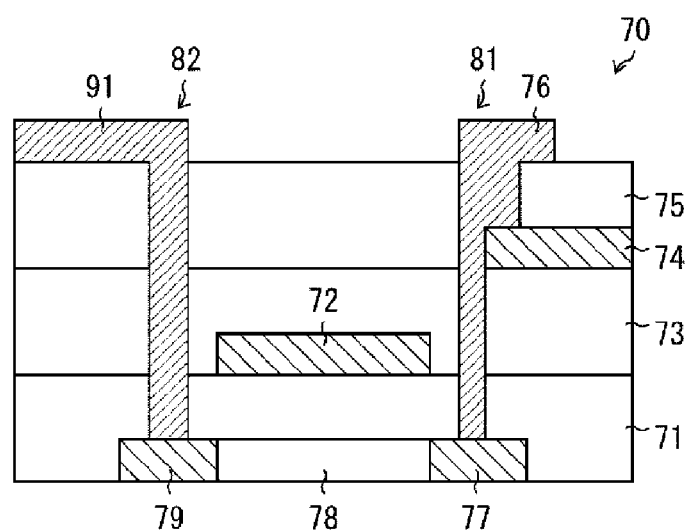
FIG. 6 is a cross-sectional view illustrating another configuration example an electrode contact structure formed near electrostatic capacitance in a shift register.

FIG. 6 is a cross-sectional view illustrating another configuration example of an electrode contact structure 70 formed near the electrostatic capacitance C1 in the shift register SRk. The electrode contact structure 70 illustrated in FIG. 6 includes, in sequence from the bottom side, a semiconductor electrode 77 (first electrode), a gate insulating film 71 (first inorganic insulating film), an inorganic insulating film 73 (second inorganic insulating film), a capacitance electrode 74 (second electrode), an inorganic insulating film 75 (third inorganic insulating film), and a source electrode 76 (third electrode). The semiconductor electrode 77 is a source region or a drain region of the semiconductor layer of the transistor T5 (first transistor), the capacitance electrode 74 is one of a pair of capacitance electrodes forming the electrostatic capacitance C1, and the source electrode 76 is the source electrode of the transistor T1 (second transistor). Another capacitance electrode that forms the electrostatic capacitance C1 is the conductive layer 72a formed in the same layer as the gate electrode 72.

In the electrode contact structure 70 of FIG. 6, the semiconductor electrode 77 is formed under the gate insulating film 71. The semiconductor electrode 77 is a semiconductor electrode constituted with such that a low-temperature polysilicon is doped with an impurity element such as phosphorus or boron. The semiconductor electrode 77 constitutes part of the semiconductor layer of the transistor T5. The inorganic insulating film 73 is formed on the gate insulating film 71. The capacitance electrode 74 is formed on the inorganic insulating film 73.

In the electrode contact structure 70, a contact hole 81 is formed passing through part of the gate insulating film 71, part of the inorganic insulating film 73, and part of the inorganic insulating film 75. In the contact hole 81, part of the capacitance electrode 74 overlaps part of the semiconductor electrode 77 with the gate insulating film. 71 and the inorganic insulating film 73 interposed therebetween. Part of the capacitance electrode 74 functions as an etching stopper when the opening is formed in the gate insulating film 71 and the inorganic insulating film 73. The source electrode 76 covers the contact hole 81, and electrically connects to the semiconductor electrode 77 and the capacitance electrode 74 exposed in the contact hole 81. In the contact hole 81, the semiconductor electrode 77 and the capacitance electrode 74 are physically separated and electrically connected to each other via the source electrode 76.

In the configuration of FIG. 6, a low-temperature polysilicon layer 78 and a semiconductor electrode 79, which are both semiconductors, are formed in the same layer as the semiconductor electrode 77. The semiconductor electrode 77 is disposed on one end portion side of the low-temperature polysilicon layer 78 in the planar direction, and is in contact with one end portion of the low-temperature polysilicon layer 78. The semiconductor electrode 79 is disposed on the other end portion side of the low-temperature polysilicon layer 78 in the planar direction, and is in contact with the other end portion of the low-temperature polysilicon layer 78. The low-temperature polysilicon layer 78 and the semiconductor electrode 79 constitute part of the semiconductor layer of the transistor T5.

A contact hole 82 is formed immediately above the semiconductor electrode 79, and a source electrode 91, is formed to cover the contact hole 82. In the contact hole 82, the source electrode 91 is directly connected to the semiconductor electrode 79. The source electrode 91 is the source electrode of the transistor T5.

Figure 7:
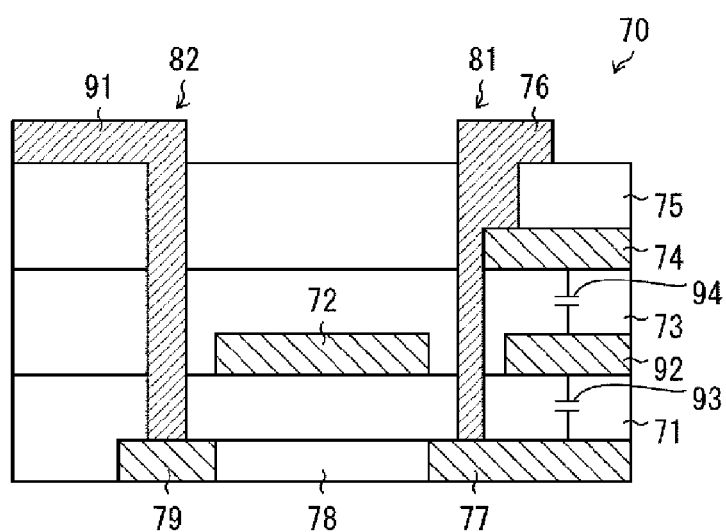
FIG. 7 is a cross-sectional view illustrating another configuration example of an electrode contact structure formed near electrostatic capacitance in a shift register.

FIG. 7 is a cross-sectional view illustrating another configuration example of an electrode contact structure 70 formed near the electrostatic capacitance C1 in the shift register SRk. The electrode contact structure 70 of FIG. 7 further includes a gate electrode 92 (fourth electrode) in addition to all the constituent members provided in the electrode contact structure 70 of FIG. 6. In the electrode contact structure 70 of FIG. 7, the semiconductor electrode 77 is formed to be longer in the planar direction thereof than that of FIG. 6.

The gate electrode 92 is a gate electrode of any transistor other than the transistor T5 provided in the subpixel circuit PXC. The gate electrode 92 is formed as the same layer as the gate electrode 72 of the transistor T5 above the gate insulating film 71 and, under the inorganic insulating film 73. The gate electrode 92 overlaps with both the semiconductor electrode 77 and the source electrode 76. As a result, electrostatic capacitance 93 (first capacitance) is formed by the semiconductor electrode 77 and the gate electrode 92. Furthermore, electrostatic capacitance 94 (second capacitance) is formed by the capacitance electrode 74 having the same potential as the semiconductor electrode 77 and the gate electrode 92. By forming the electrostatic capacitance 93 and electrostatic capacitance 94, the shift register SRk may be formed with higher density.

Modification Example

The electrode contact structure 70 is not limited to the gate driver GD, and may also be formed in the source driver SD. In the case where the electrode contact structure 70 is formed in both the gate driver GD and the source driver SD, both the gate driver GD and the source driver SD can be made smaller, thereby making it possible for the display device 2 and the display apparatus 1 to be constituted with a further narrower frame.

The electrode contact structure 70 may also be applied to the subpixel circuit PXC, for example, as illustrated in FIG. 3. In this configuration, in the electrode contact structure 70, the gate electrode (first electrode) of the transistor Ta, the source electrode (third electrode) of the transistor Tf, and one of the capacitance electrodes (the capacitance electrode on the side of the transistors Ta and Tf, the second electrode) forming the electrostatic capacitance Cp are electrically connected. By forming the electrode contact structure 70 in the subpixel circuit PXC, the subpixel circuit PXC can be made smaller, which makes it possible to further increase the degree of freedom in the design of the subpixel circuit PXC.

Figure 8:
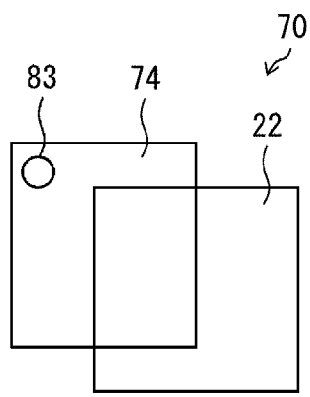
FIG. 8 is a plan view illustrating a configuration example of an electrode contact structure formed in a subpixel circuit.

FIG. 8 is a plan view illustrating a configuration example of an electrode contact structure 70 formed in the subpixel circuit PXC. As illustrated in this drawing, in the electrode contact structure 70, a capacitance electrode 74 forming the electrostatic capacitance Cp can overlap an anode electrode 22 (pixel electrode) in the light-emitting element layer 5. In this configuration, a contact hole 83 for connecting the source electrode 76 and the anode electrode 22 does not overlap the anode electrode 22.

In the display apparatus 1, electrostatic capacitance is formed between the gate electrode 72 and silicon (not illustrated) disposed under the gate insulating film 71. Furthermore, by causing part of the capacitance electrode 74 to overlap part of the gate electrode 72, since the capacitance electrode 74 is disposed near the silicon, electrostatic capacitance is also formed between the capacitance electrode 74 and the silicon. As described above, in the display apparatus 1, since the electrode contact structure 70 including the gate electrode 72 and the capacitance electrode 74 is integrated, the amount of electrostatic capacitance formed can be made larger than that in the conventional art.

Manufacturing Method for Electrode Contact Structure 70

The electrode contact structure 70 illustrated in FIG. 5 is manufactured, for example, as follows. First, the gate electrode 72 is formed on the gate insulating film 71. Next, the inorganic insulating film 73 is formed on the gate electrode 72 and the gate insulating film 71 in such a manner as to cover the gate electrode 72. Next, the capacitance electrode 74 is formed on the inorganic insulating film 73 in such a manner that part of the gate electrode 72 and part of the capacitance electrode 74 overlap each other. Next, the inorganic insulating film 75 is formed on the inorganic insulating film 73 and the capacitance electrode 74 in such a manner as to cover the capacitance electrode 74. Next, the contact hole 81 is formed by etching part of the inorganic insulating film 75. At this time, a range including the overlapping portion of the gate electrode 72 and the capacitance electrode 74 and the periphery thereof is subject to etching.

Since the capacitance electrode 74 functions as an etching stopper, the etching stops at a position on the capacitance electrode 74. On the other hand, the etching advances into the inorganic insulating film 73 disposed immediately under the inorganic insulating film 75, so that an opening is formed in part of the inorganic insulating film 73. Since the gate electrode 72 functions as an etching stopper, the etching stops at a position on the gate electrode 72. In this manner, the contact hole 81 is formed by etching the inorganic insulating film 73 and the inorganic insulating film 75 at a time. After forming the contact hole 81, the source electrode 76 is formed on the inorganic insulating film 75, the gate electrode 72, and the capacitance electrode 74 in such a manner as to lie extending in the contact hole 81.

This method is able to etch the inorganic insulating film 73 and the inorganic insulating film 75 at a time using a single mask. Therefore, it is unnecessary to increase the number of masks, and therefore, the yield of manufacturing is less likely to be degraded.

Supplement

Aspect 1: an electrode contact structure includes a first inorganic insulating film; a first electrode formed on the first inorganic insulating film; a second inorganic insulating film formed on the first inorganic insulating film and the first electrode to cover the first electrode; a second electrode formed on the second inorganic insulating film; a third inorganic insulating film formed on the second inorganic insulating film and the second electrode to cover the second electrode; and a third electrode configured to cover a contact hole formed in the third inorganic insulating film and the second inorganic insulating film, and electrically connect to each of the first electrode and the second electrode exposed in the contact hole.

Aspect 2: in the electrode contact structure of Aspect 1, part of the first electrode and part of the second electrode overlap each other in the contact hole.

Aspect 3: an electrode contact structure includes a first inorganic insulating film; a first electrode formed under the first inorganic insulating film; a second inorganic insulating film formed on the first inorganic insulating film; a second electrode formed on the second inorganic insulating film; a third inorganic insulating film formed on the second inorganic insulating film and the second electrode to cover the second electrode; and a third electrode configured to cover a contact hole formed in the first inorganic insulating film, the second inorganic insulating film and the third inorganic insulating film, and electrically connect to each of the first electrode and the second electrode exposed in the contact hole.

Aspect 4: the electrode contact structure of Aspect 3 further includes a fourth electrode formed on the first inorganic insulating film and under the second inorganic insulating film and overlapping with the first electrode and the second electrode.

Aspect 5: in the electrode contact structure of Aspect 4, first electrostatic capacitance is formed by the first electrode and the fourth electrode, second electrostatic capacitance is formed by the second electrode and the fourth electrode, and the first electrode and the second electrode are electrically connected via the third electrode in the contact hole.

Aspect 6: in the electrode contact structure of any one of Aspects 3 to 5, the first electrode is a semiconductor electrode doped with an impurity element.

Aspect 7: in the electrode contact structure of Aspect 1 or 3, the second electrode is one of electrodes forming electrostatic capacitance and overlaps with a pixel electrode.

Aspect 8: a display control driver includes the electrode contact structure described in Aspect 1 or 2.

Aspect 9: the display control driver of Aspect 8 further includes a first transistor, a second transistor, and a capacitance electrode, in which the first electrode is a gate electrode of the first transistor, the second electrode is the capacitance electrode, and the third electrode is a source electrode of the second transistor.

Aspect 10: a display device includes the electrode contact structure described in any one of Aspects 1 to 8.

Aspect 11: in the display device of Aspect 10, the electrode contact structure is formed in a pixel circuit.

Aspect 12: the display device of Aspect 10 or 11 is an organic EL display device.

The present disclosure is not limited to each of the embodiments described above, and various modifications may be implemented within a range not departing from the scope of the claims. Embodiments obtained by appropriately combining technical approaches stated in each of the different embodiments also fall within the scope of the technology of the present disclosure. Novel technical features may also be formed by combining the technical approaches stated in each of the embodiments.

REFERENCE SIGNS LIST

2 Display device
GD Gate driver (Display control driver)
70 Electrode contact structure
71 Gate insulating film (First inorganic insulating film)
72 Gate electrode (First electrode)
73 Inorganic insulating film (Second inorganic insulating film)
74 Capacitance electrode (Second electrode)
75 Inorganic insulating film (Third inorganic insulating film)
76 Source electrode (Third electrode)
77 Semiconductor electrode (First electrode)
78 Low-temperature polysilicon layer
79 Semiconductor electrode
81 Contact hole
82 Contact hole
91 Source electrode
92 Gate electrode (Fourth electrode)

The invention claimed is:

1. An electrode contact structure comprising:
a first inorganic insulating film;
a first electrode formed under the first inorganic insulating film;
a second inorganic insulating film formed on the first inorganic insulating film;
a second electrode formed on the second inorganic insulating film;
a third inorganic insulating film formed on the second inorganic insulating film and the second electrode to cover the second electrode;
a third electrode configured to cover a contact hole formed in the first inorganic insulating film, the second inorganic insulating film and the third inorganic insulating film, and electrically connect to each of the first electrode and the second electrode exposed in the contact hole; and
a fourth electrode formed on the first inorganic insulating film and under the second inorganic insulating film and overlapping with the first electrode and the second electrode.

2. The electrode contact structure according to claim 1, wherein first electrostatic capacitance is formed by the first electrode and the fourth electrode,
second electrostatic capacitance is formed by the second electrode and the fourth electrode, and
the first electrode and the second electrode are electrically connected via the third electrode in the contact hole.

3. The electrode contact structure according to claim 1, wherein the first electrode is a semiconductor electrode doped with an impurity element.

4. The electrode contact structure according to claim 1, wherein the second electrode is one of electrodes forming electrostatic capacitance and overlaps with a pixel electrode.

5. A display device comprising:
the electrode contact structure according to claim 1.

6. The display device according to claim 5, wherein the electrode contact structure is formed in a pixel circuit.

7. The display device according to claim 5, wherein the display device is an organic EL display device.

* * * * *